(12) United States Patent
Jeong et al.

(10) Patent No.: US 8,872,207 B2
(45) Date of Patent: Oct. 28, 2014

(54) ORGANIC LIGHT-EMITTING DISPLAY APPARATUS AND METHOD OF MANUFACTURING THE SAME

(75) Inventors: Hee-Seong Jeong, Yongin (KR); Soon-Ryong Park, Yongin (KR); Sun-Hwa Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 266 days.

(21) Appl. No.: 13/446,407

(22) Filed: Apr. 13, 2012

(65) Prior Publication Data
US 2013/0168712 A1    Jul. 4, 2013

(30) Foreign Application Priority Data
Dec. 28, 2011 (KR) .................. 10-2011-0144981

(51) Int. Cl.
*H01L 51/52* (2006.01)
*H01L 51/54* (2006.01)
*H01L 51/56* (2006.01)

(52) U.S. Cl.
USPC ........ 257/98; 257/40; 257/E51.018; 257/100; 313/512; 438/29

(58) Field of Classification Search
CPC ............ H01L 51/5256; H01L 51/5262; H01L 51/5268; H01L 51/5275; H01L 51/56
USPC .............. 257/40, E51.018–E51.021, 98, 100; 313/504, 506, 512; 438/29
See application file for complete search history.

(56) References Cited

U.S. PATENT DOCUMENTS

| 2007/0126353 | A1 | 6/2007 | Kubota et al. |
| 2007/0267973 | A1 | 11/2007 | Suh |
| 2008/0012477 | A1 | 1/2008 | Koo et al. |
| 2011/0147721 | A1 | 6/2011 | Han |
| 2012/0256218 | A1* | 10/2012 | Kwack et al. ................... 257/98 |

FOREIGN PATENT DOCUMENTS

| JP | 2008-515129 | 5/2008 |
| KR | 10-2007-0111002 | 11/2007 |
| KR | 10-2008-0006304 | 1/2008 |
| KR | 10-2011-0071530 | 6/2011 |

* cited by examiner

*Primary Examiner* — Matthew W Such
*Assistant Examiner* — Scott Stowe
(74) *Attorney, Agent, or Firm* — Robert E. Bushnell, Esq.

(57) ABSTRACT

An organic light-emitting display apparatus includes: a substrate; a pixel electrode disposed on the substrate; a counter electrode disposed on the pixel electrode and capable of transmitting light; an organic emission layer disposed between the pixel electrode and the counter electrode so as to emit light toward at least the counter electrode; and a light-transmitting layer disposed on the counter electrode along a path of light emitted from the organic emission layer and including at least one inorganic film and organic films separated by the inorganic film. At least two of the organic films each include a first material having a first refractive index and a second material having a second refractive index. The first refractive index is greater than the second refractive index, and the first material is dispersed in the second material in the form of plurality of particles.

20 Claims, 5 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 28th of Dec. 2011 and there duly assigned Serial No. 10-2011-0144981.

BACKGROUND OF THE INVENTION

1. Field of the Invention

The present invention relates to an organic light-emitting display apparatus and a method of manufacturing the same.

2. Description of the Related Art

An organic light-emitting display apparatus includes an organic light-emitting diode (OLED) including a hole injection electrode, an electron injection electrode, and an organic emission layer between the hole and electron injection electrodes, and it is a self-emissive display apparatus in which light is emitted while excitons, generated when holes injected by the hole injection electrode and electrons injected by the electron injection electrode, are combined in the organic emission layer in transit from an excited state to a ground state.

As self-emissive display apparatuses, organic light-emitting display apparatuses may be driven at a low voltage, may have small weight and thickness because an additional light source is not required, and are regarded as next-generation display apparatuses due to their excellent characteristics, such as wide viewing angles, high contrast, and fast response speeds.

However, since light emitted from an organic emission layer does not have directivity, and since some of the emitted light does not exit externally due to total reflection, light efficiency is reduced.

Also, since an organic light-emitting display apparatus deteriorates due to, for example, external moisture or oxygen, an OLED is sealed to protect the OLED from external moisture or oxygen.

Currently, in order to manufacture thin and/or flexible organic light-emitting display apparatuses, thin film encapsulation (TFE) is performed to seal an OLED by using a plurality of organic and inorganic films.

However, since light is externally emitted along different paths due to TFE, a color shift is generated at a side viewing angle of the organic light-emitting display apparatus.

SUMMARY OF THE INVENTION

The present invention provides an organic light-emitting display apparatus capable of reducing a color shift generated at a side viewing angle and increasing light efficiency, and a method of manufacturing the same.

According to an aspect of the present invention, there is provided an organic light-emitting display apparatus including a substrate; a pixel electrode disposed on the substrate; a counter electrode disposed on the pixel electrode and capable of transmitting light; an organic emission layer disposed between the pixel electrode and the counter electrode to emit light toward at least the counter electrode; and a light-transmitting layer disposed on the counter electrode along a path of the light emitted from the organic emission layer, and including at least one inorganic film and a plurality of organic films separated by the inorganic film, wherein at least two of the organic films each include a first material having a first refractive index and a second material having a second refractive index, wherein the first refractive index is greater than the second refractive index, and wherein the first material is dispersed in the second material.

The light-transmitting layer may include a first organic film disposed adjacent to the counter electrode and including the first and second materials; a second organic film disposed uppermost among the organic films, and including the first and second materials; and an inorganic film disposed between the first and second organic films.

The light-transmitting layer may include a plurality of inorganic films and a plurality of organic films which are alternately disposed, and the organic films each may include the first and second materials.

The first material may have a refractive index greater than 1.5.

The first material may have a particle diameter of 0.1 μm to 5 μm.

The first material may include at least one of zirconium (Zr), tungsten (W), and silicon (Si).

The light-transmitting layer may have a thickness equal to or less than 50 μm.

The organic light-emitting display apparatus may further include a protective layer disposed between the counter electrode and the light-transmitting layer.

The organic light-emitting display apparatus may further include an optical member disposed on the light-transmitting layer.

The substrate may be a flexible substrate.

According to another aspect of the present invention, there is provided a method of manufacturing an organic light-emitting display apparatus, the method including forming a pixel electrode on a substrate; forming an organic emission layer on the pixel electrode; forming a counter electrode, capable of transmitting light, on the organic emission layer; and forming a light-transmitting layer including at least one inorganic film and a plurality of organic films separated by the inorganic film, on the counter electrode along a path of light emitted from the organic emission layer, wherein at least two of the organic films each include a first material having a first refractive index and a second material having a second refractive index, wherein the first refractive index is greater than the second refractive index, and wherein the first material is dispersed in the second material.

The forming of the light-transmitting layer may include forming a first organic film, including the first and second materials, on the counter electrode; forming the inorganic film on the first organic film; and forming a second organic film, including the first and second materials, on the inorganic film.

The forming of the light-transmitting layer may include alternately forming a plurality of inorganic films and a plurality of organic films, each including the first and second materials.

The first material may have a refractive index greater than 1.5.

The first material may have a particle diameter of 0.1 μm to 5 μm.

The first material may include at least one of zirconium (Zr), tungsten (W), and silicon (Si).

The light-transmitting layer may have a thickness equal to or less than 50 μm.

The method may further include forming a protective layer on the counter electrode after the counter electrode is formed.

The method may further include forming an optical member on the light-transmitting layer after the light-transmitting layer is formed.

The substrate may be a flexible substrate, and the method may further include forming the substrate on a supporting substrate before the pixel electrode is formed on the substrate, and removing the supporting substrate from the substrate after the light-transmitting layer is formed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described in detail by explaining embodiments of the invention with reference to the attached drawings.

As used herein, the term "and/or" includes any and all combinations of one or more of the associated listed items. Expressions such as "at least one of," when preceding a list of elements, modify the entire list of elements and do not modify the individual elements of the list.

Figure 1:
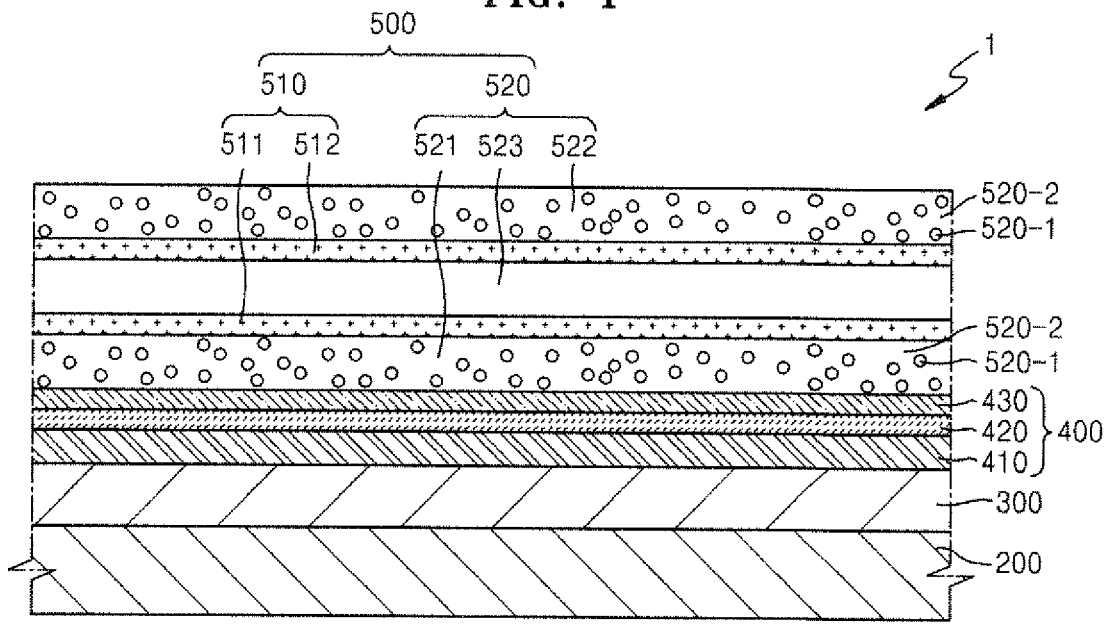
FIG. 1 is a cross-sectional view of an organic light-emitting display apparatus according to an embodiment of the present invention.
Figure 2:
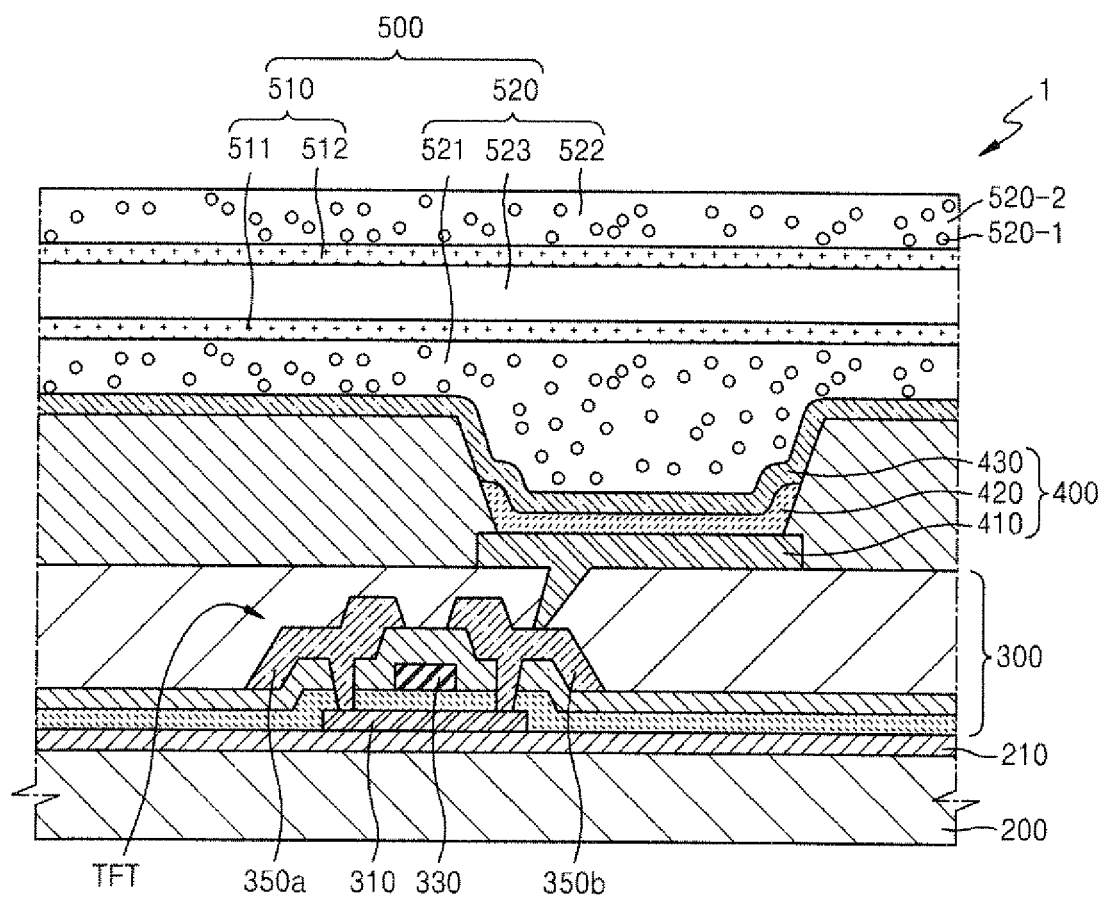
FIG. 2 is a cross-sectional view of one pixel region of the organic light-emitting display apparatus illustrated in FIG. 1.

FIG. 1 is a cross-sectional view of an organic light-emitting display apparatus according to an embodiment of the present invention; and FIG. 2 is a cross-sectional view of one pixel region of the organic light-emitting display apparatus illustrated in FIG. 1.

Referring to FIGS. 1 and 2, the organic light-emitting display apparatus 1 includes a substrate 200; an organic light-emitting diode (OLED) 400 including a pixel electrode 410 disposed on the substrate 200, a counter electrode 430 disposed on the pixel electrode 410 and capable of transmitting light, and an organic emission layer 420 disposed between the pixel electrode 410 and the counter electrode 430 so as to emit light toward at least the counter electrode 430; and a light-transmitting layer 500 disposed on the counter electrode 430 along a path of the light emitted from the organic emission layer 420, and including inorganic films 510 and a plurality of organic films 520 separated by the inorganic films 510.

The light-transmitting layer 500 includes first and second inorganic films 511 and 512, respectively, and first through third organic films 521 through 523, respectively, separated by the first and second inorganic films 511 and 512, respectively. In the light-transmitting layer 500, the first organic film 521 disposed to contact the counter electrode 430, and the second organic film 522 disposed uppermost each include a first material 520-1 having a first refractive index and a second material 520-2 having a second refractive index. The first refractive index is greater than the second refractive index, and the first material 520-1 is dispersed in the second material 520-2 in the form of a plurality of particles.

The substrate 200 may be a flexible substrate, and may be formed of plastic having excellent heat resistance and durability, e.g., polyethylene terephthalate (PET), polyethylene naphthalate (PEN), polycarbonate (PC), polyarylate (PAr), polyetherimide (PEI), polyethersulfone (PES), or polyimide (PI). However, the present invention is not limited thereto, and the substrate 200 may also be formed of various materials such as metal or glass.

An element/wiring layer 300 may be disposed on the substrate 200, and may include a driving thin film transistor TFT for driving the OLED 400, a switching thin film transistor (not shown), a capacitor (not shown), and wirings (not shown) connected to the driving thin film transistor TFT and the capacitor.

The driving thin film transistor TFT includes an active layer 310, a gate electrode 330, and source and drain electrodes 350a and 350b, respectively.

A barrier layer 210 for preventing penetration of an external foreign substance, such as moisture or oxygen, into the OLED 400 through the substrate 200 may be further disposed between the substrate 200 and the element/wiring layer 300. The barrier layer 210 may include an inorganic material and/or an organic material, and prevents penetration of an external foreign substance into the element/wiring layer 300 and the OLED 400 through the substrate 200.

The OLED 400 is disposed on the element/wiring layer 300. The OLED 400 includes the pixel electrode 410, the organic emission layer 420 disposed on the pixel electrode 410, and the counter electrode 430 formed on the organic emission layer 420.

In the current embodiment, the pixel electrode 410 is an anode and the counter electrode 430 is a cathode. However, the present invention is not limited thereto and, according to the driving method of the organic light-emitting display apparatus 1, the pixel electrode 410 may be a cathode and the counter electrode 430 may be an anode. Holes and electrons are injected from the pixel electrode 410 and the counter electrode 430, respectively, into the organic emission layer 420. Light is emitted while excitons, formed when the injected holes and electrons are combined, transit from an excited state to a ground state.

The pixel electrode 410 is electrically connected to the driving thin film transistor TFT of the element/wiring layer 300.

Although the OLED 400 is disposed on the element/wiring layer 300 including the driving thin film transistor TFT in the current embodiment, the present invention is not limited thereto and various modifications may be allowed here. For example, the pixel electrode 410 of the OLED 400 may be formed at the same level as the active layer 310, the gate electrode 330, or the source and drain electrodes 350a and 350b, respectively, of the driving thin film transistor TFT.

Furthermore, although the gate electrode 330 of the driving thin film transistor TFT is disposed on the active layer 310 in the current embodiment, the present invention is not limited thereto and the gate electrode 330 may also be disposed under the active layer 310.

The pixel electrode 410 of the OLED 400 may be a reflective electrode, and may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or translucent electrode layer formed on the reflective film.

The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 430, disposed to face the pixel electrode 410, may be a transparent or translucent electrode, and may be formed as a metallic thin film including lithium (Li), calcium (Ca), lithium fluoride/calcium (LiF/Ca), lithium fluoride/aluminum (LiF/Al), aluminum (Al), silver (Ag), magnesium (Mg), or a compound thereof, and having a low work function. Also, an auxiliary electrode layer or a bus electrode may be further formed on the metallic thin film by using a material for forming a transparent electrode, e.g., ITO, IZO, ZnO, or $In_2O_3$.

Accordingly, the counter electrode 430 may transmit the light emitted from the organic emission layer 420.

The organic emission layer 420 is disposed between the pixel electrode 410 and the counter electrode 430, and may be formed of a low-molecular or high-molecular organic material.

In addition to the organic emission layer 420, intermediate layers such as a hole transport layer (HTL), a hole injection layer (HIL), an electron transport layer (ETL), and an electron injection layer (EIL) may be selectively disposed between the pixel electrode 410 and the counter electrode 430.

The organic light-emitting display apparatus 1 may be a top emission type display apparatus in which the light emitted from the organic emission layer 420 is emitted toward the counter electrode 430 directly or after being reflected on the pixel electrode 410 formed as a reflective electrode.

The light-transmitting layer 500, including one or more inorganic films 510 and the plurality of organic films 520, is disposed on the counter electrode 430.

The light-transmitting layer 500 includes the first and second organic films 521 and 522, respectively, each including the first material 520-1 having a first refractive index and the second material 520-2 having a second refractive index that is less than the first refractive index. The first organic film 521 is disposed so as to contact the counter electrode 430, and the second organic film 522 is disposed uppermost among the organic films 520.

Although the first and second inorganic films 511 and 512, respectively, and the third organic film 523 are disposed between the first and second organic films 521 and 522, respectively, of the light-transmitting layer 500 in the current embodiment, the number of inorganic and organic films 510 and 520, respectively, is not limited thereto.

The inorganic films 510 may be formed of metal oxide, metal nitride, metal carbide, or a compound thereof, e.g., aluminum oxide, silicon oxide, or silicon nitride. The inorganic films 510 suppress penetration of external moisture and/or oxygen into the OLED 400.

The second material 520-2 included in the organic films 520 may include acryl, polyimide, polycarbonate, or the like, and may be formed of a monomer in order to make the organic light-emitting display apparatus 1 thin. The organic films 520 reduce internal stress of, complement defects of, and planarize the inorganic films 510.

The second material 520-2 generally has a refractive index equal to or less than 1.5. In this case, the first material 520-1 may have a refractive index greater than 1.5. However, if the second material 520-2 is formed of a resin having a high refractive index, the first material 520-1 may have a refractive index equal to or greater than 2.0.

Since the first material 520-1 has a refractive index greater than that of the second material 520-2, the light incident into the light-transmitting layer 500 at a fixed angle may be effectively scattered.

The first material 520-1 may be dispersed in the second material 520-2 in the form of a plurality of particles having a spherical shape. Also, the first material 520-1 may include one of zirconium (Zr), tungsten (W), and silicon (Si), and may be, for example, $SiN_x$, $ZrO_x$, or $WO_x$.

Furthermore, the first material 520-1 may have a particle diameter of 0.1 μm to 5 μm.

The light-transmitting layer 500 may have a thickness equal to or less than 50 μm. The light-transmitting layer 500 includes the second organic film 522 disposed uppermost and including the first and second materials 520-1 and 520-2. If the distance between the organic emission layer 420 and the second organic film 522 is increased, an image displayed by the organic light-emitting display apparatus 1 may be blurred, and thus may have a low quality. Accordingly, the light-transmitting layer 500 may have a thickness equal to or less than 50 μm.

The light emitted from the organic emission layer 420 is incident onto the light-transmitting layer 500 directly or after being reflected on the pixel electrode 410.

The light emitted from the organic emission layer 420 does not have directivity. When the light is emitted from the organic emission layer 420 into a material having a low refractive index, light having an incident angle equal to or greater than a certain value is totally reflected and is not emitted externally.

In this case, a proceeding direction of the light emitted from the OLED 400 is changed by disposing, on the OLED 400, the light-transmitting layer 500, including the first organic film 521 in which the first material 520-1 is dispersed in the second material 520-2.

Therefore, if the light-transmitting layer 500 is disposed, a proceeding direction of some light, that may not be emitted externally due to a large incident angle when the light-transmitting layer 500 is not disposed, may be changed and an incident angle of the light may be reduced, and thus, the light may be emitted externally.

Accordingly, light efficiency of the organic light-emitting display apparatus 1 may be improved. A detailed description thereof will be provided below with reference to FIG. 9.

The light transmitted through the first organic film 521 is incident onto the second organic film 522. In this case, due to the first material 520-1 having a refractive index greater than that of the second material 520-2 and having a particle diameter equal to or less than 5 μm, a proceeding direction of the light incident into the second organic film 522 is changed, and the light is emitted externally at various angles.

The light emitted from the organic emission layer 420 does not have directivity and proceeds along different optical paths. Accordingly, although light having a desired level of color purity is emitted in front of the organic light-emitting display apparatus 1, a color shift is generated at a side viewing angle.

However, in the current embodiment, light that proceeds along different optical paths is transmitted through the first organic film 521, is incident onto the second organic film 522, and is emitted externally at different angles, and the light that proceeds along different optical paths is mixed in front, and at a side, of the organic light-emitting display apparatus 1.

Accordingly, the difference in color coordinates in front, and at a side, of the organic light-emitting display apparatus 1, i.e., a color shift at a side viewing angle, may be reduced.

A method of manufacturing the organic light-emitting display apparatus 1 will now be described.

FIGS. 3 through 6 are sequential cross-sectional views for describing a method of manufacturing the organic light-emitting display apparatus illustrated in FIG. 1 according to an embodiment of the present invention.

Figure 3:
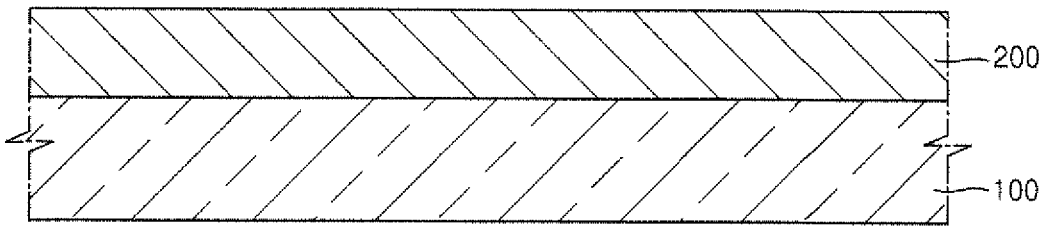
FIGS. 3 through 6 are sequential cross-sectional views for describing a method of manufacturing the organic light-emitting display apparatus illustrated in FIG. 1 according to an embodiment of the present invention.

Referring to FIG. 3, the substrate 200 is formed on a supporting substrate 100. In this case, the substrate 200 may be a flexible substrate, and may be formed of plastic having excellent heat resistance and durability.

Since a flexible substrate is deformed by heat, a thin film transistor or an OLED may not be easily precisely formed on the flexible substrate. Accordingly, subsequent processes may be performed after the flexible substrate is bonded onto the supporting substrate 100 formed of, for example, glass.

Figure 4:
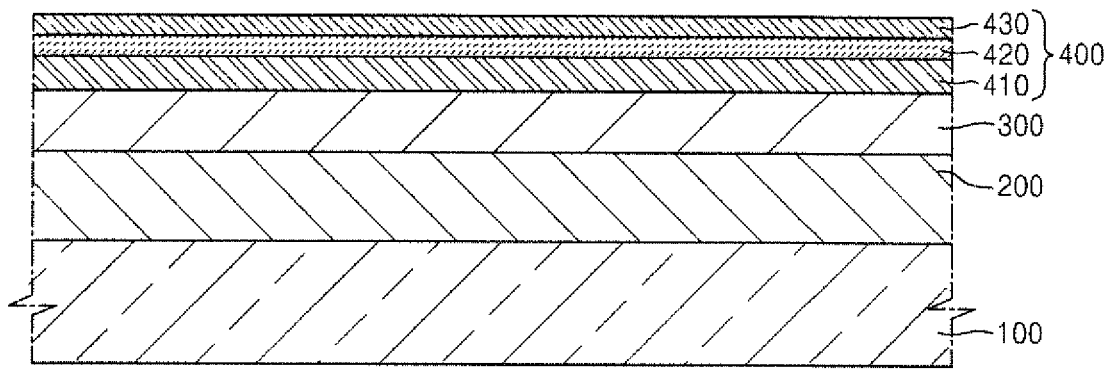

Referring to FIG. 4, the element/wiring layer 300 and the OLED 400, including the pixel electrode 410, the organic emission layer 420, and the counter electrode 430, are formed on the substrate 200.

The barrier layer 210 illustrated in FIG. 2 may be formed before the element/wiring layer 300 is formed on the substrate 200. The barrier layer 210 may include an inorganic material and/or an organic material, and prevents penetration of an external foreign substance into the element/wiring layer 300 and the OLED 400 through the substrate 200.

The element/wiring layer 300 may include the driving thin film transistor TFT (see FIG. 2) for driving the OLED 400, a capacitor (not shown), and wirings (not shown).

The pixel electrode 410, the organic emission layer 420, and the counter electrode 430 are sequentially formed on the element/wiring layer 300.

The pixel electrode 410 may be a reflective electrode, and the counter electrode 430 may be a transparent or translucent electrode. Accordingly, light generated by the organic emission layer 420 may be emitted toward the counter electrode 430 directly or after being reflected on the pixel electrode 410.

In this case, the counter electrode 430 may be formed as a translucent electrode, and thus the pixel electrode 410 and the counter electrode 430 may form a resonance structure.

The organic emission layer 420 may be formed of a low-molecular or high-molecular organic material. In addition to the organic emission layer 420, the intermediate layers stated above relative to FIGS. 1 and 2 may be selectively formed between the pixel electrode 410 and the counter electrode 430.

Although the OLED 400 is formed on the element/wiring layer 300 in the current embodiment, the present invention is not limited thereto, and the element/wiring layer 300 and the OLED 400 may be formed at the same level.

Figure 5:
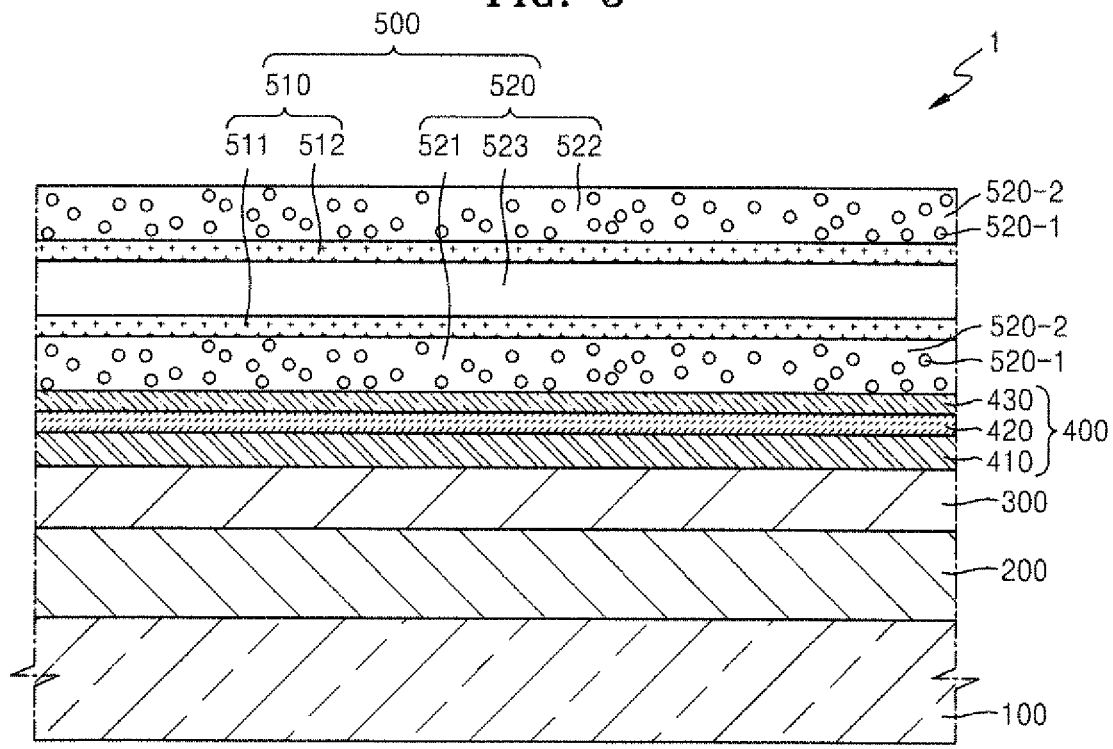

Referring to FIG. 5, the inorganic and organic films 510 and 520, respectively, are alternately formed on the counter electrode 430 along a path of the light emitted from the organic emission layer 420.

In this case, the organic films 520 are formed in a plural number, at least two of the organic films 520 each include the first material 520-1 having a first refractive index and the second material 520-2 having a second refractive index that is less than the first refractive index, and the first material 520-1 is dispersed in the second material 520-2 in the form of a plurality of particles.

In this case, the first refractive index may be greater than 1.5, and more particularly, equal to or greater than 2.0. Also, the first material 520-1 may be dispersed in the second material 520-2 in the form of a plurality of particles having a spherical shape, may include one of Zr, W, and Si, and may be, for example, $SiN_x$, $ZrO_x$, or $WO_x$.

Furthermore, the first material 520-1 may have a particle diameter of 0.1 μm to 5 μm.

The second material 520-2 may be a resin such as acryl, polyimide, or polycarbonate, and may be formed of a monomer.

In the current embodiment, two inorganic films 510 and three organic films 520 are alternately disposed. Two of the three organic films 520 each include the first and second materials 520-1 and 520-2, respectively, the first organic film 521 is disposed adjacent to the counter electrode 430, and the second organic film 522 is disposed uppermost. In this case, the third organic film 523 is disposed between the first and second organic films 521 and 522, respectively, does not include the second material 520-2, and may be formed of only an organic material.

In this case, the first and second materials 520-1 and 520-2, respectively, included in the first organic film 521, may be the same as or different from those included in the second organic film 522.

Also, a forming order and the number of inorganic and organic films 510 and 520, respectively, are not limited to the above descriptions.

Figure 6:
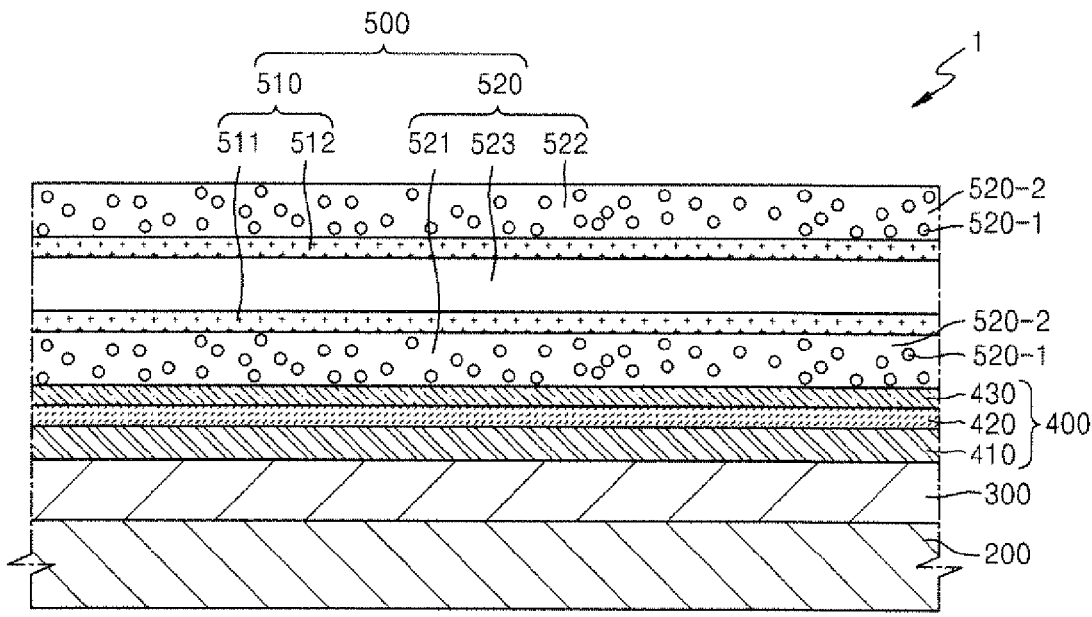

Referring to FIG. 6, the supporting substrate 100 is removed from the substrate 200. The supporting substrate 100 may be separated from the substrate 200 by using a well-known method, such as etching.

Figure 7:
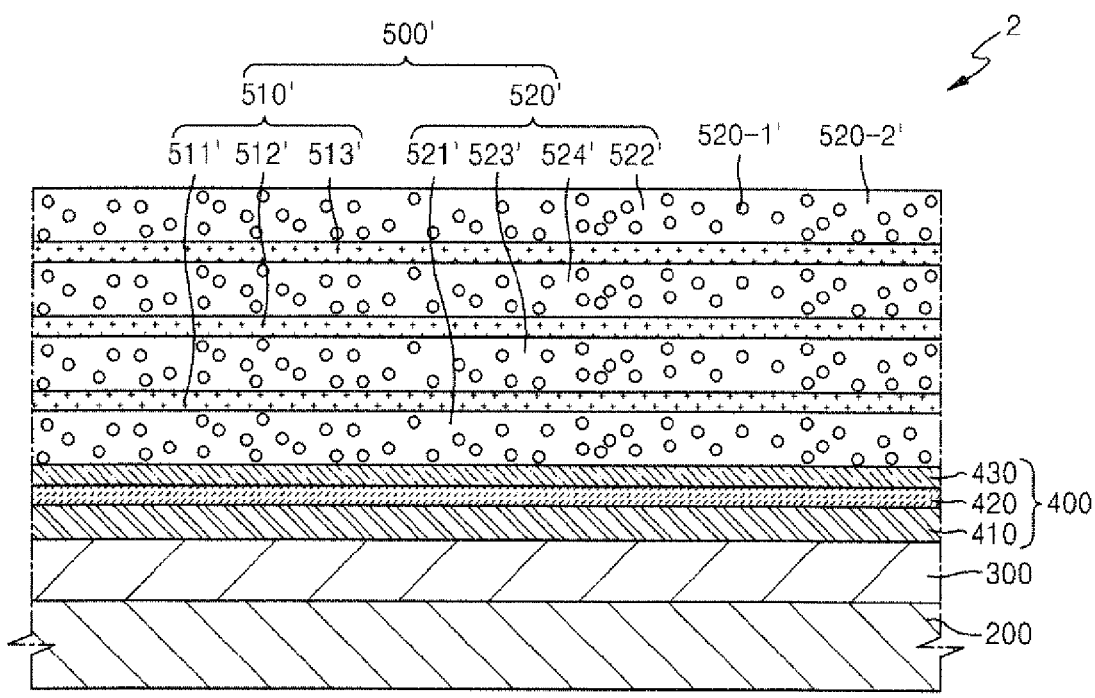
FIG. 7 is a cross-sectional view of an organic light-emitting display apparatus according to another embodiment of the present invention.

FIG. 7 is a cross-sectional view of an organic light-emitting display apparatus according to another embodiment of the present invention.

Referring to FIG. 7, most elements of the organic light-emitting display apparatus 2 are the same as those of the organic light-emitting display apparatus 1 illustrated in FIGS. 1 and 2, and the difference is a light-transmitting layer 500'. The organic light-emitting display apparatus 2 will now be described in detail, mainly with respect to differences from the organic light-emitting display apparatus 1.

The light-transmitting layer 500' includes a plurality of inorganic films 510' and a plurality of organic films 520', which are alternately disposed. The organic films 520' each include a first material 520-1' having a first refractive index and a second material 520-2' having a second refractive index that is less than the first refractive index. The inorganic films 510' include three inorganic films 511' through 513' spaced apart from each other, and the organic films 520' include four organic films 521' through 524' separated by the inorganic films 510'.

In this case, the first refractive index may be greater than 1.5, and more particularly, equal to or greater than 2.0. Also, the first material 520-1' may be dispersed in the second material 520-2' in the form of a plurality of particles having a spherical shape, may include one of Zr, W, and Si, and may be, for example, $SiN_x$, $ZrO_x$, or $WO_x$.

The first material 520-1' may have a particle diameter of 0.1 μm to 5 μm.

The second material 520-2' may be a resin such as acryl, polyimide, or polycarbonate, and may be formed of a monomer.

In the current embodiment, since the organic films 520' included in the light-transmitting layer 500' each include the second material 520-2' and the first material 520-1' dispersed in the second material 520-2' in the form of a plurality of particles, light efficiency of the organic light-emitting display apparatus 2 may be improved, and a color shift generated at a side viewing angle of the organic light-emitting display apparatus 2 may be reduced.

In this case, the first and second materials 520-1' and 520-2', respectively, included in each organic film 520' may be the same as, or different from, those included in another organic film 520'.

The other elements of the organic light-emitting display apparatus 2 are the same as those of the organic light-emitting display apparatus 1 illustrated in FIGS. 1 and 2, and thus, detailed descriptions thereof are not provided here.

Figure 8:
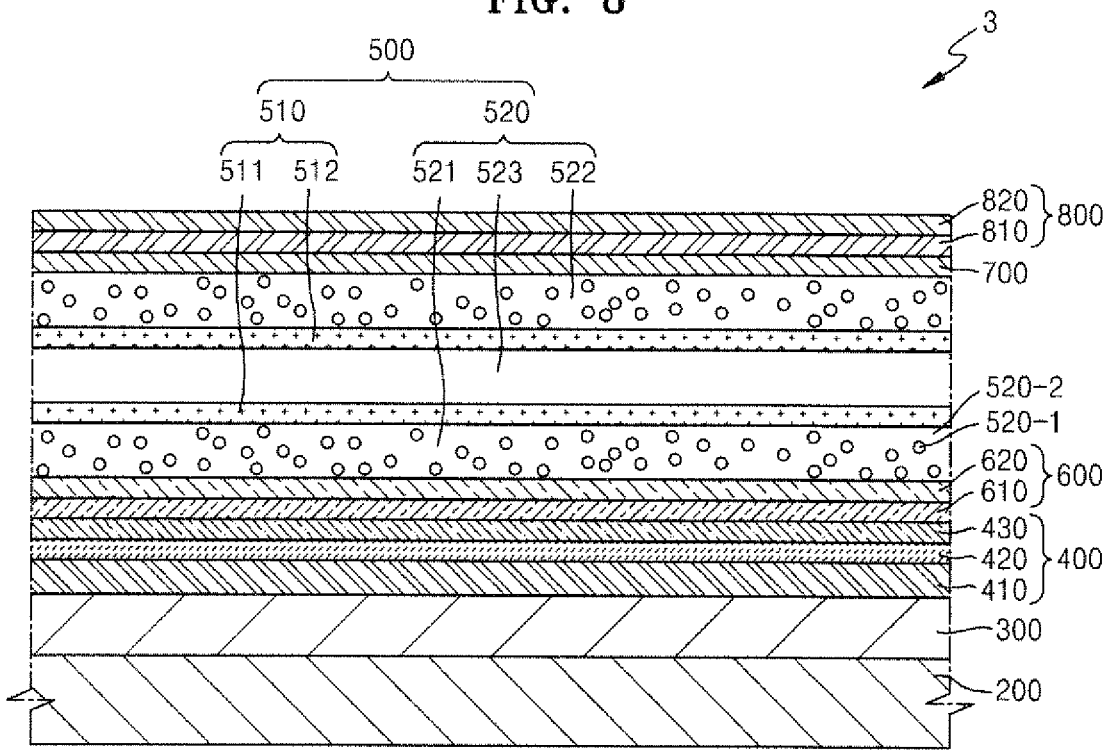
FIG. 8 is a cross-sectional view of an organic light-emitting display apparatus according to another embodiment of the present invention.

FIG. 8 is a cross-sectional view of an organic light-emitting display apparatus according to another embodiment of the present invention.

Referring to FIG. 8, most elements of the organic light-emitting display apparatus 3 are the same as those of the organic light-emitting display apparatus 1 illustrated in FIGS. 1 and 2, and the difference is that a first protective layer 600 is further included between the OLED 400 and the light-transmitting layer 500, and that a second protective layer 700 and an optical member 800 are further included on the light-transmitting layer 500.

The light-transmitting layer 500 includes the inorganic films 510 and the organic films 520 which are alternately disposed. In the light-transmitting layer 500, the organic films 520 include the first organic film 521 disposed adjacent to the OLED 400, the second organic film 522 disposed uppermost, and the third organic film 523 disposed between the first and second organic films 521 and 522, respectively.

Here, the first and second organic films 521 and 522, respectively, each include the first material 520-1 having a first refractive index and the second material 520-2 having a second refractive index that is less than the first refractive index.

In this case, the first refractive index may be greater than 1.5, and more particularly, equal to or greater than 2.0. Also, the first material 520-1 may be dispersed in the second material 520-2 in the form of a plurality of particles having a spherical shape, may include one of Zr, W, and Si, and may have a particle diameter of 0.1 µm to 5 µm.

The second material 520-2 may be dispersed in the second material 520-2 in the form of a plurality of particles having a spherical shape, may include one of Zr, W, and Si, and may be, for example, $SiN_x$, $ZrO_x$, or $W_{Ox}$.

Furthermore, the first material 520-1 may be a resin such as acryl, polyimide, or polycarbonate, and may be formed of a monomer.

In the current embodiment, the light-transmitting layer 500 includes the first and second inorganic films 511 and 512, respectively, disposed between the first and second organic films 521 and 522, respectively, and the third organic film 523, and the first protective layer 600 may be disposed between the counter electrode 430 and the light-transmitting layer 500.

The first protective layer 600 may include a capping layer 610 and an inorganic layer 620. The capping layer 610 may include, for example, 8-quinolinolato lithium, NN,N-diphenyl-N,N-bis(9-phenyl-9H-carbazol-3-yl)biphenyl-4,4'-diamine), N(diphenyl-4-yl)9,9-dimethyl-N-(4(9-phenyl-9H-carbazol-3-yl)phenyl)-9H-fluorene-2-amine), or (2-(4-(9,10-di(naphthalene-2-yl)anthracene-2-yl)phenyl)-1-phenyl-1H-benzo-[D]imidazole, and the inorganic layer 620 may include, for example, lithium fluoride (LiF).

The first protective layer 600 prevents damage to the counter electrode 430 while the organic light-emitting display apparatus 3 is used or manufactured.

The second protective layer 700 and the optical member 800 may be disposed on the light-transmitting layer 500.

The second protective layer 700 may include an inorganic material having a refractive index similar to that of the second organic film 522. The second protective layer 700 prevents penetration of external moisture and/or oxygen into the light-transmitting layer 500 and the OLED 400.

The optical member 800 may include a phase delay plate 810 and a polarizing plate 820, and the phase delay plate 810 may be a λ/4 plate.

The optical member 800 improves visibility and contrast of the organic light-emitting display apparatus 3 by suppressing reflection of external light.

The other elements of the organic light-emitting display apparatus 3 are the same as those of the organic light-emitting display apparatus 1 illustrated in FIGS. 1 and 2, and thus, detailed descriptions thereof are not provided here.

Figure 9:
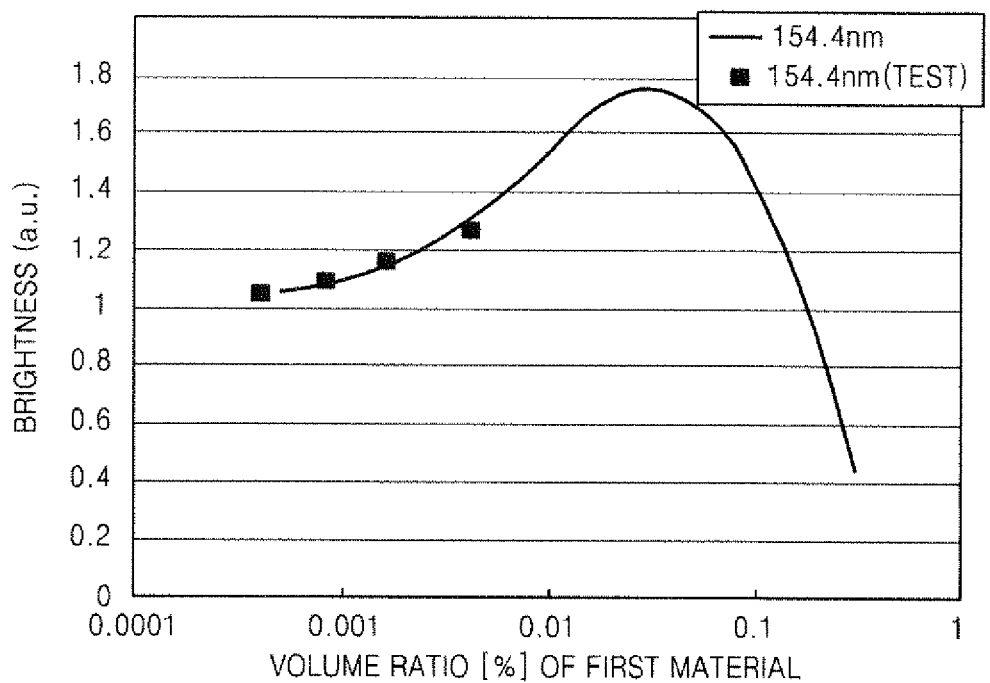
FIG. 9 is a graph showing the brightness of light emitted from the organic light-emitting display apparatus illustrated in FIG. 1.

FIG. 9 is a graph showing the brightness of light emitted from the organic light-emitting display apparatus illustrated in FIG. 1.

In the graph, the horizontal axis represents a volume ratio (%) of the first material 520-1 in each of the first and second organic films 521 and 522, respectively, and the vertical axis represents the brightness of emitted light. The brightness of emitted light on the vertical axis has an arbitrary unit, and the value 1 represents a brightness value when the first material 520-1 is not included.

In this case, the first material 520-1 may be formed as particles including $ZrO_2$, having a refractive index of 2.2, and having a particle diameter of 154.4 nm.

Referring to FIG. 9, if the volume ratio of the first material 520-1 is increased, the brightness value increases and then reduces.

If the volume ratio of the first material 520-1 has a value between 0.01 and 0.1, the brightness value is maximized. In this case, the brightness value, i.e., the efficiency of emitted light, is increased by about 70% in comparison to a case where the first material 520-1 is not included.

Figure 10:
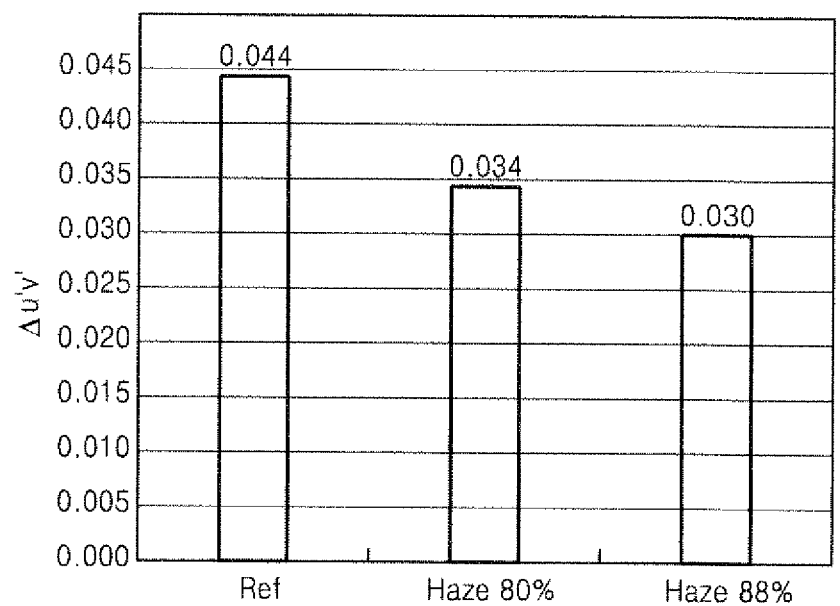
FIG. 10 is a graph showing color shift values at a side of the organic light-emitting display apparatus illustrated in FIG. 1.

FIG. 10 is a graph showing color shift values at a side of the organic light-emitting display apparatus illustrated in FIG. 1.

In the graph, the vertical axis represents a difference between a color coordinate value in front of the organic light-emitting display apparatus 1 of FIG. 1 and a color coordinate value at a region laterally slanted by 60° from the front (Δu'v'), i.e., a color shift at a side of the organic light-emitting display apparatus 1.

Referring to FIG. 10, if the first material 520-1 is not included (Ref), a color shift is reduced when haze values are 80% and 88%.

The organic light-emitting display apparatuses 1, 2 and 3 illustrated in FIGS. 1, 7 and 8, respectively, may reduce a color shift generated at a side viewing angle, and may increase the efficiency of emitted light.

According to the present invention, the color shift generated at a side viewing angle may be reduced.

Also, the efficiency of emitted light may be increased.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
   a substrate;
   a pixel electrode disposed on the substrate;

a counter electrode disposed on the pixel electrode and capable of transmitting light;

an organic emission layer disposed between the pixel electrode and the counter electrode for emitting light toward at least the counter electrode; and a light-transmitting layer disposed on the counter electrode along a path of the light emitted from the organic emission layer and including at least one inorganic film and a plurality of organic films separated by said at least one inorganic film, wherein at least two of the organic films each comprise a first material having a first refractive index and a second material having a second refractive index, wherein the first refractive index is greater than the second refractive index, and wherein the first material is dispersed in the second material.

2. The organic light-emitting display apparatus of claim 1, wherein said plurality of organic films included in the light-transmitting layer comprise:

a first organic film disposed adjacent to the counter electrode and including the first and second materials; and a second organic film disposed uppermost among the organic films and including the first and second materials;

wherein said at least one inorganic film comprises an inorganic film disposed between the first and second organic films.

3. The organic light-emitting display apparatus of claim 1, wherein said at least one inorganic film included in the light-transmitting layer comprises a plurality of inorganic films, and the plurality of inorganic films and the plurality of organic films are alternately disposed; and wherein the organic films each comprise the first and second materials.

4. The organic light-emitting display apparatus of claim 1, wherein the first material has a refractive index greater than 1.5.

5. The organic light-emitting display apparatus of claim 1, wherein the first material has a particle diameter in a range of 0.1 μm to 5 μm.

6. The organic light-emitting display apparatus of claim 1, wherein the first material comprises at least one of zirconium (Zr), tungsten (W), and silicon (Si).

7. The organic light-emitting display apparatus of claim 1, wherein the light-transmitting layer has a thickness not greater than 50 μm.

8. The organic light-emitting display apparatus of claim 1, further comprising a protective layer disposed between the counter electrode and the light-transmitting layer.

9. The organic light-emitting display apparatus of claim 1, further comprising an optical member disposed on the light-transmitting layer.

10. The organic light-emitting display apparatus of claim 1, wherein the substrate is a flexible substrate.

11. A method of manufacturing an organic light-emitting display apparatus, the method comprising the steps of:

forming a pixel electrode on a substrate;

forming an organic emission layer on the pixel electrode;

forming a counter electrode, capable of transmitting light, on the organic emission layer; and forming a light-transmitting layer, including at least one inorganic film and a plurality of organic films separated by said at least one inorganic film, on the counter electrode along a path of light emitted from the organic emission layer, wherein at least two of the organic films each comprise a first material having a first refractive index and a second material having a second refractive index, wherein the first refractive index is greater than the second refractive index, and wherein the first material is dispersed in the second material.

12. The method of claim 11, wherein the step of forming the light-transmitting layer comprises:

forming a first organic film, including the first and second materials, on the counter electrode;

forming an inorganic film on the first organic film; and forming a second organic film, including the first and second materials, on the inorganic film.

13. The method of claim 11, wherein the step of forming the light-transmitting layer comprises alternately forming a plurality of inorganic films and a plurality of organic films, each comprising the first and second materials.

14. The method of claim 11, wherein the first material has a refractive index greater than 1.5.

15. The method of claim 11, wherein the first material has a particle diameter in a range of 0.1 μm to 5 μm.

16. The method of claim 11, wherein the first material comprises at least one of zirconium (Zr), tungsten (W), and silicon (Si).

17. The method of claim 11, wherein the light-transmitting layer has a thickness not greater than 50 μm.

18. The method of claim 11, further comprising the step of forming a protective layer on the counter electrode after the counter electrode is formed.

19. The method of claim 11, further comprising the step of forming an optical member on the light-transmitting layer after the light-transmitting layer is formed.

20. The method of claim 11, wherein the substrate is a flexible substrate, and wherein the method further comprises the steps of:

forming the substrate on a supporting substrate before the pixel electrode is formed on the substrate; and removing the supporting substrate from the substrate after the light-transmitting layer is formed.

* * * * *